United States Patent [19]
Whiteley

[11] Patent Number: 4,926,067
[45] Date of Patent: May 15, 1990

[54] INTEGRATED SUPERCONDUCTING SAMPLING OSCILLOSCOPE

[75] Inventor: Steve R. Whiteley, Shrub Oak, N.Y.
[73] Assignee: Hypres, Inc., Elmsford, N.Y.
[21] Appl. No.: 323,266
[22] Filed: Mar. 15, 1989

Related U.S. Application Data

[63] Continuation of Ser. No. 101,418, Sep. 28, 1987, abandoned.
[51] Int. Cl.$^5$ .............. H03K 17/92; H03K 19/195; H03K 3/38
[52] U.S. Cl. .................. 307/352; 307/245; 307/277; 307/306; 357/5; 505/861; 505/863; 505/865
[58] Field of Search .............. 307/352, 306, 245, 277, 307/476; 357/5; 365/162

[56] References Cited

U.S. PATENT DOCUMENTS

| | | |
|---|---|---|
| 3,764,905 | 10/1973 | Zappe . |
| 4,117,503 | 9/1978 | Zappe . |
| 4,245,169 | 1/1981 | Hamilton . |
| 4,334,158 | 6/1982 | Faris . |
| 4,361,768 | 11/1982 | Rajeevakumar ............... 307/245 |
| 4,401,900 | 8/1983 | Faris . |
| 4,533,840 | 8/1985 | Gheewala et al. . |
| 4,638,185 | 1/1987 | Kobayashi et al. . |

FOREIGN PATENT DOCUMENTS

| | | |
|---|---|---|
| 0031871 | 7/1981 | European Pat. Off. . |
| 0195364 | 8/1986 | Japan ............... 307/245 |
| 991197 | 5/1965 | United Kingdom . |
| 1282230 | 7/1972 | United Kingdom . |

OTHER PUBLICATIONS

Sampling Techniques Primer TEK 7000 Series Modular Oscilloscopes, Technique Primer 42W-5969 ©1985.
TEK Products, 1987 Tektronix pp. 254–256.
"Analog Measurement Applications for High Speed Josephson Switches" Hamilton et al., IEEE Transactions on Magnetics vol. MAG-17, No. 1, Jan. 1981.
"Picosecond Sampling with Josephson Junctions" by Peter Wolf, Picosecond Electronics and Optoelectronics, Edited by Mourou et al, Springer Vertag.
IBM Journal of Research and Developement vol. 24, No. 2/Mar. 1980, pp. 107–264.

Primary Examiner—John Zazworsky
Attorney, Agent, or Firm—Kenyon & Kenyon

[57] ABSTRACT

An Integrated Superconductor Sampling Oscilloscope may include a sampling gate utilizing superconductor devices such as a Josephson junction device as well as external circuitry for producing a visual representation of an input signal responsive to the output of the sampling gate. The oscilloscope may further comprise an attenuator for receiving the input signal, a trigger recognizer comprising superconductor devices which produces a pulse signal when the input signal from the attenuator exceeds a threshold level, a hold-off gate which produces an output signal when the pulse signal from the trigger recognizer is produced concurrently with a gating event, and electrical variable delay which may comprise superconducting devices and produces a delayed pulse signal in response to an output signal by the hold-off gate and a strobe pulse generator which produces a signal to the sampling gate in response to the pulse signal from the electrical variable delay output. The result is an oscilloscope achieving a low jitter trigger from the input signal itself so as to allow viewing of the leading pulse of an input signal.

14 Claims, 4 Drawing Sheets

INTEGRATED SUPERCONDUCTING SAMPLING OSCILLOSCOPE

This is a continuation of Ser. No. 101,418, filed 9/28/87, now abandoned.

TECHNICAL FIELD OF THE INVENTION

The invention relates to an integrated superconducting sampling oscilloscope. The oscilloscope utilizes superconducting devices in a sampling oscilloscope. In particular the circuitry makes use of the high sensitivity of Josephson junction devices and the wide band width of superconducting transmission lines.

BACKGROUND OF THE INVENTION

Oscilloscopes are often times utilized for providing a visual representation of an input signal. It is desirable for the oscilloscope to allow viewing of the leading edge of an input signal.

In conventional oscilloscopes in order to allow an operator to view a leading edge of the input signal, a stable pre-trigger signal must be provided. Circuitry that is provided in conventional oscilloscopes for producing the stable pre-trigger signal makes the conventional oscilloscope cumbersome to operate. The circuitry utilized in the conventional oscilloscopes tends to suffer from time jitter and consequent performance degradation as well.

The use of superconducting devices and particularly Josephson tunneling devices, in sampling or Analog/-Digital (A/D) circuits is already known in the art. Use of a Josephson device provides a very sensitive detector, offering the possibility of very fast sampling speeds because such a device is capable of extremely fast switching speed between two stable states and because the device responds to extremely small magnetic fields.

U.S. Pat. No. 4,401,900 shows a Josephson sampling technique with a time resolution of 5 picoseconds and a sensitivity of 10 microvolts. The time resolution for the described sampling system is extendable to the sub-picosecond domain, limited ultimately by the intrinsic switching speed of the Josephson device used as the sampling gate. In principle, the switching speed can be as little as 0.09 picoseconds.

Josephson sampling techniques are not restricted to only those waveforms produced in a cryogenic environment. Rather, they can be used to measure waveforms from various sources such as x-rays, optical photons or electrical waveforms produced by room temperature sources, if a suitable interface is available. Examples of such interfaces are described in the co-pending patent applications Ser. No. 796,841 entitled "Room Temperature to Cryogenic Electrical Interface" filed on Nov. 12, 1985 and Ser. No. 796,842 entitled "Open Cycle Cooling of Electrical Circuits" filed on Nov. 12, 1985.

The Josephson sampling system described in U.S. Pat. No. 4,401,900 comprises a superconductive monitor gate such as a single Josephson device, which has at least two states distinguishable from one another and which is sensitive to an unknown waveform or signal to be sampled. Switching means which include, the source of the unknown signal, a source of timing pulses and a source of bias signal change the state of a monitor gate by a proper combination of the above signals. A timing means is provided to establish both a timing reference and an accurate sampling delay time. The timing means includes a pulse generator for providing very short sampling pulses, delay lines and a source of trigger pulses. The sampling system also has noise elimination means to insure the accuracy of the sample at any given instant of time and a display to indicate the unknown waveform.

A sampling system that utilizes superconducting devices must be integrated with other circuitry so as to enable the viewing of the leading edge of an input signal in an oscilloscope. Circuitry utilized with the sampling gate in a sampling oscilloscope should provide low time jitter triggering and high performance.

SUMMARY OF THE INVENTION

The present invention provides circuitry for use with a sampling gate and additional electronics in an integrated superconducting sampling oscilloscope. The circuitry provides low jitter triggering so that the leading edge of an input signal may be viewed without rendering the oscilloscope too cumbersome.

The present invention obviates the problems associated with conventional oscilloscopes by providing an integrated superconducting sampling oscilloscope, including a sampling gate and additional electronics, comprising:

(a) first means for producing a first trigger signal;
(b) sensing means for detecting said first trigger signal, said sensing means producing a pulse signal when said first trigger signal is detected;
(c) second means for gating said pulse signal, said means for gating producing an output signal when said pulse signal exists concurrently with a gating event;
(d) third means for producing a second trigger signal that has a variable delay, from said output signal of said second means;
(e) strobing means responsive to said second trigger signal for producing a strobe pulse signal to the sampling gate; and
(f) delay means responsive to said first trigger signal for producing a signal having a fixed delay to the sampling gate.

The sensing means may comprise a superconductor device that produces a pulse signal when the first trigger signal exceeds a predetermined threshold and a biasing means for setting the predetermined threshold of the superconductor device.

The third means may comprise a first superconductor device having a predetermined switching threshold, said first superconductor device producing a first switching signal if said output signal exceeds said predetermined switching threshold; means for receiving said first switching signal and producing a resonant signal; and a second superconductor device having a second switching threshold, said second superconductor device receiving said resonant signal and producing said second trigger signal when said resonant signal exceeds said second switching threshold.

The use of the superconductor devices permits the entire circuitry described above to be disposed on a single chip. This provides a great reduction in size and enhances the overall characteristics of the circuit.

BRIEF DESCRIPTION OF THE DRAWINGS

The present invention will be understood with reference to the detailed description given herein below with reference being made to the accompanying drawings wherein.

DETAILED DESCRIPTION

Figure 1:
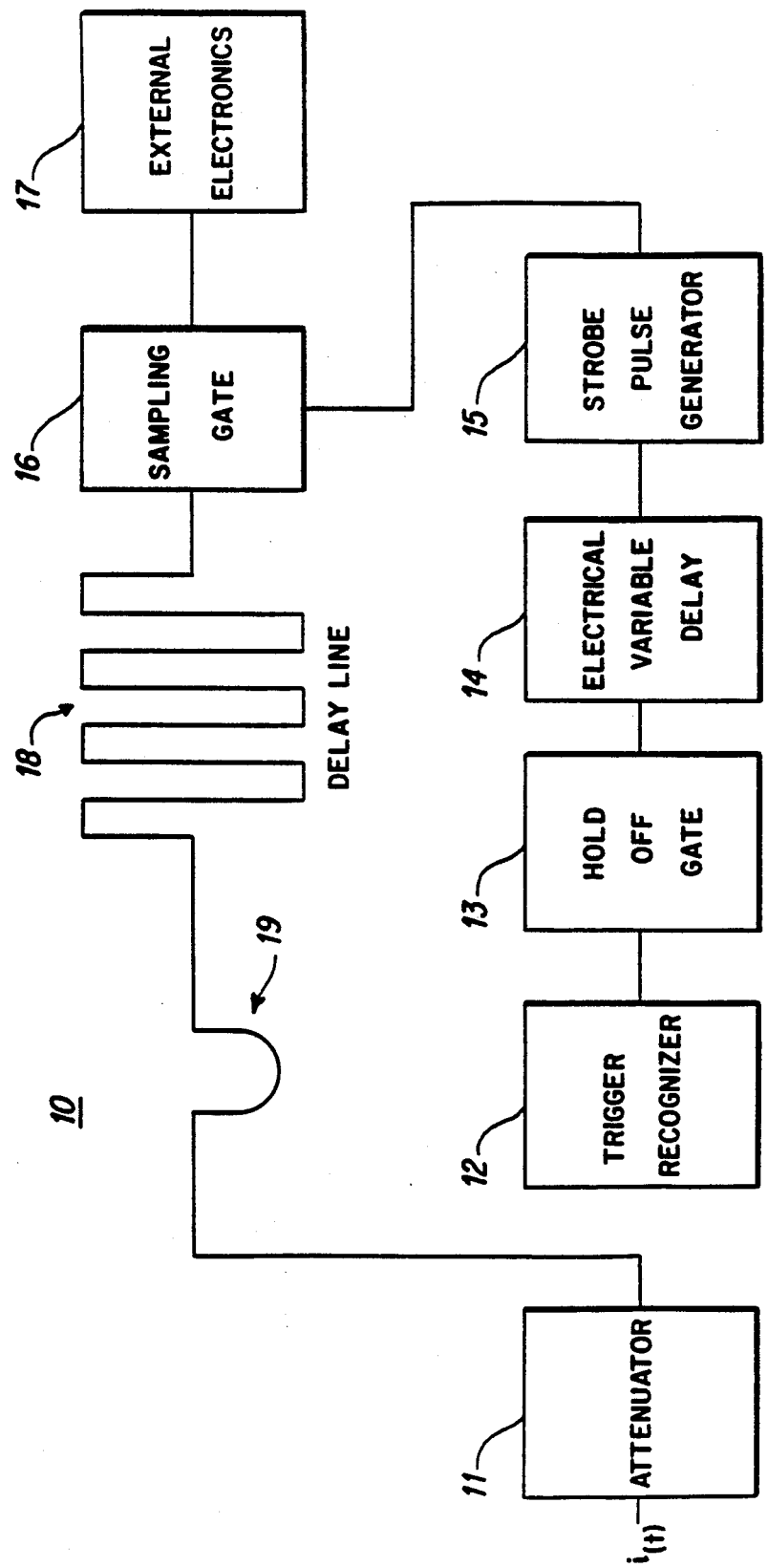
FIG. 1 is a block diagram representation of an embodiment of the circuitry of the present invention in an integrated sampling oscilloscope.

FIG. 1 illustrates, in schematic form, a portion of an integrated superconducting sampling oscilloscope. The circuitry of the present invention is disposed on a single chip.

Attenuator 11 receives input signal i(t), a signal which varies with respect to time. The attenuator 11 provides signal attenuation so that large signals can be measured without overdriving a sampling gate 16 or a trigger recognizer 12. With respect to a 1 volt (1 V) attenuator, adequate power dissipation becomes an issue. The attenuator 11 may include one or more resistors disposed on the chip whereby all of the resistors are of equal width, for example 20 microns, wide to allow scaling of lithography variations.

Parallel strips are used to increase current handling capability. Four such parallel strips may be used in the input of the 1 V attenuator. Such an attenuator should be able to handle as much as 80 ma without failure or significant drift, if one assumes, as has been shown from previous studies, that 20 ma per strip is safe. The area on the chip required to construct this attenuator will be relatively large and will contribute about 5 picoseconds to the rise time of the signal. A 0.1 volt attenuator input utilizes only two parallel strips while a 0.01 volt attenuator uses only a single strip as an input. The attenuators also provide impedance matching between a 50 ohm input upon which i(t) first appears and a 16 ohm delay line 18.

Immediately following the attenuator in the circuit is a trigger recognizer 12 which is responsive to a signal appearing on a control coil 19. Control coil 19 acts as a control line for the trigger recognizer 12. The trigger recognizer is illustrated in greater detail in FIG. 2 and will be further described below. In general however, the trigger recognizer 12 has a preset triggering level. When an input signal is attenuated by attenuator 11 it appears on coil control line 19. If the attenuated signal exceeds the triggering level the trigger recognizer produces a pulse signal. The pulse signal is transmitted to a hold off gate 13. Hold off gate 13 produces a current pulse when trigger recognizer 12 has produced a pulse at the same time as a particular gating event. The gating event is represented by a specific current that is injected into a hold off line of the hold off gate 13. Therefore, an output signal, the current pulse, is produced by the hold off gate 13 when the pulse signal from the trigger recognizer 12 exists concurrently with a gating event. The output signal is received by an electrical variable delay 14. The electrical variable delay is described in greater detail with respect to FIG. 3 in a detailed description that follows herein. The electrical variable delay 14 receives the output signal of the hold off gate as an input. If this input exceeds a specific threshold a resonant signal is produced in the electrical variable delay element 14. When the resonant signal exceeds a variable threshold level, the electrical variable delay 14 produces an output signal of its own, a second trigger signal. The second trigger signal is provided as an input to a strobe pulse generator 15. The second trigger signal acts as a trigger for the strobe pulse generator 15 causing it to generate a current pulse that is applied to sampling gate 16. Paralleling the signal sequence of trigger recognizer 12, hold off gate 13, electrical variable delay 14, and strobe pulse generator 15, the attenuated input signal from attenuator 11, passes through control coil 19 and is an input to delay line 18. The delay line 18 adds a fixed time delay to the signal and then introduces this signal having a fixed delay to sampling gate 16. Sampling gate 16 acts as a sampling detector to detect portions of the input signal. The sample portions are output to external electronics 17. This external circuitry produces a visual representation of the input signal which is normally required of the oscilloscope.

Figure 2:
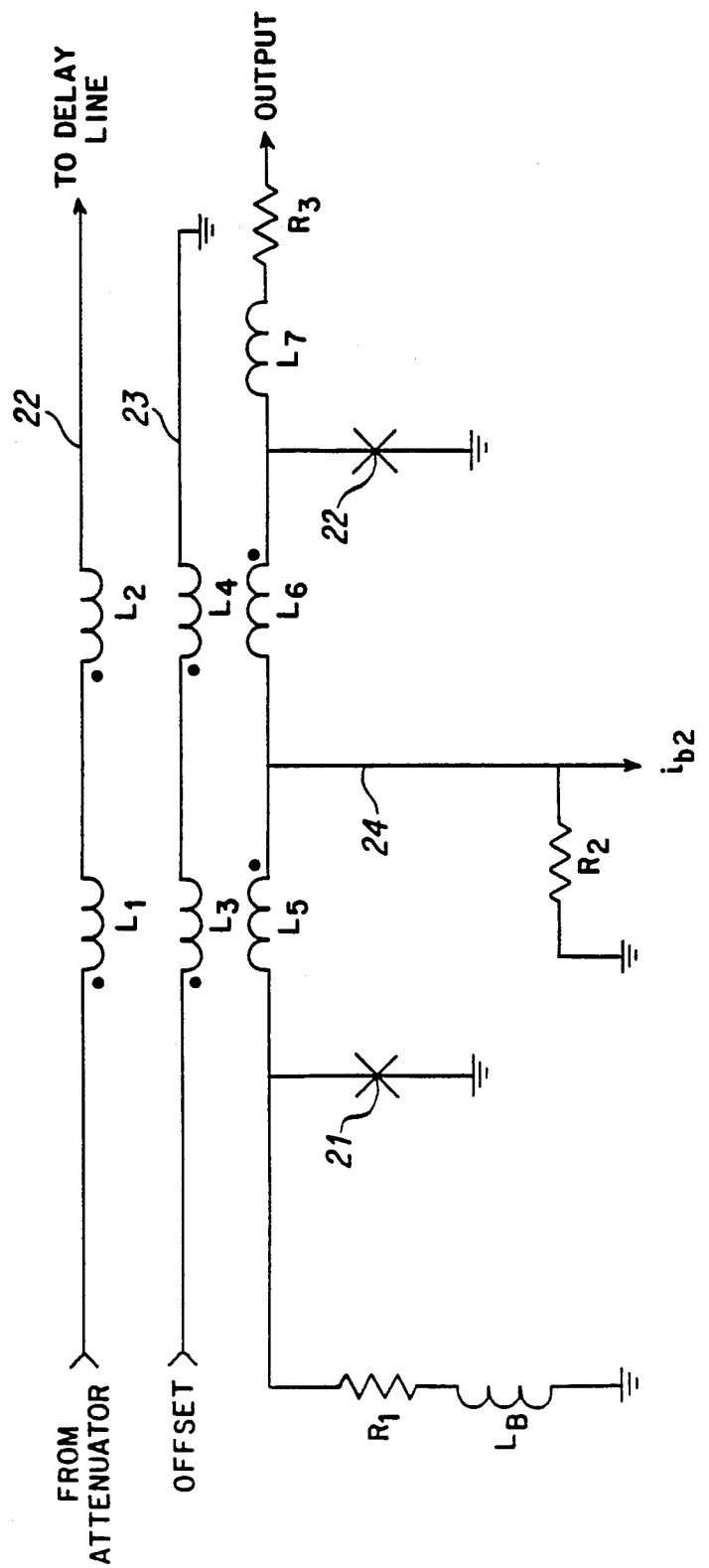
FIG. 2 is a schematic diagram for an embodiment of a trigger recognizer element from the block diagram of FIG. 1.

FIG. 2 is a more detailed schematic diagram of an embodiment of the trigger recognizer 12 of FIG. 1 and control coil 19 of FIG. 1. In FIG. 2, a first control line corresponding to control coil 19 of FIG. 1 transmits a signal produced by the attenuator 11 of FIG. 1 to the delay line 18 of FIG. 1. This control line consists of a series connection of inductors L1 and L2. A second control line 23 receives an offset signal and consists of a series connection of inductors L3 and L4. The inductors of lines 22 and 23 are arranged so as to allow magnetic coupling between inductor L1 and L3, and between inductors L2 and L4. In the embodiment of FIG. 2, the trigger recognizer 12 of FIG. 1 comprises an inductor L8 having a first end connected to a reference potential and having a second end connected to resistance R1 so as to place inductor L8 and resistance R1 in series relation. The R1-L8 connection is connected in parallel with a junction device 21. A first end of an inductor L5 is commonly connected to junction device 21 and resistance R1. A second end of inductor L5 is connected to a first end of inductor L6. The inductor L5 is positioned so as to allow magnetic coupling with inductors L1 and L3. A second end of inductor L6 is commonly connected to a first end of both a second junction device 22 and a first end of inductor L7. A second end of the second junction device 22 is connected to a reference potential and a second end of inductor L7 constitutes the output line for the trigger recognizer. A bias line 24 is connected to the second end of inductance L5 and the first end of inductance L6. A bias current ib2 is present on line 24 so as to set a threshold switching level for the junction devices 21 and 22.

The embodiment of the trigger recognizer illustrated in FIG. 2 can be described as being a two junction symmetric interferometer that is coupled to two control lines. The two junctions referred to are the two junction devices 21 and 22. One of the control lines 22 is the signal line from the attenuator (11 of FIG. 1) while the other control line 23 runs off chip to a DC bias source which, when adjusted, provides control of the triggering level of the interferometer. The interferometer is designed to have significant mode overlap. The operating point of the interferometer is chosen to be near and slightly below a mode intersection point. Both ends of the interferometer are loaded by a small inductance and resistance in series ($R_1$ and L8 on a first end and $R_3$ and $L_7$ at a second end), however on one side the inductance and resistance combination ($R_3$ and $L_7$) is coupled to the hold off gate 13 of FIG. 1. The trigger recognizer has a small load resistance which implies that the recognizer is self resetting and is therefore powered by direct current.

The trigger recognizer circuit of the present invention produces a pulse to the hold off gate 13 when a mode boundary is crossed in one selectable polarity only. For example, when a positive bias current is utilized, a rising edge of a signal along the first control line 22 will push the bias point from a first mode for example mode 0, to a second mode, for example mode 1 thereby producing a pulse as an output to the hold off gate. However, the circuit is constructed so that no pulse will be produced when the mode boundary between 0 and 1 is crossed as the signal goes from mode 1 back to mode 0. As an example, an applied signal may cause the trigger recognizer operation point to cross the 0 mode boundary from a 0 mode to the 1 mode. Such a transition generates a positive going pulse in the inductor L7 which is coupled to the hold off gate 13 of FIG. 1. This pulse indicates that a trigger event has occurred and sets the rest of the circuitry to work. As the input signal from the attenuator along control line 22 reverts to its former value, the negative side of the one mode boundary will be traversed and there will be a transition to the 0 mode which will generate a pulse in inductor L8 which is not connected to the hold off gate. The trigger recognizer is reset by the pulse at inductor L8 and it awaits another triggering event. This memory property of the trigger recognizer is important. The state of the trigger recognizer is dependent only upon the history of the signal, not the system clock or the state of any other device. By reversing the polarity of the trigger recognizer gate current, the trigger pulse will be generated on the opposite edge of the signal and with a negative polarity. The transition point of the recognizer changes with the change in the bias current however the production of output pulse is still only dependent upon the history of the input signal from the attenuator.

Figure 3:
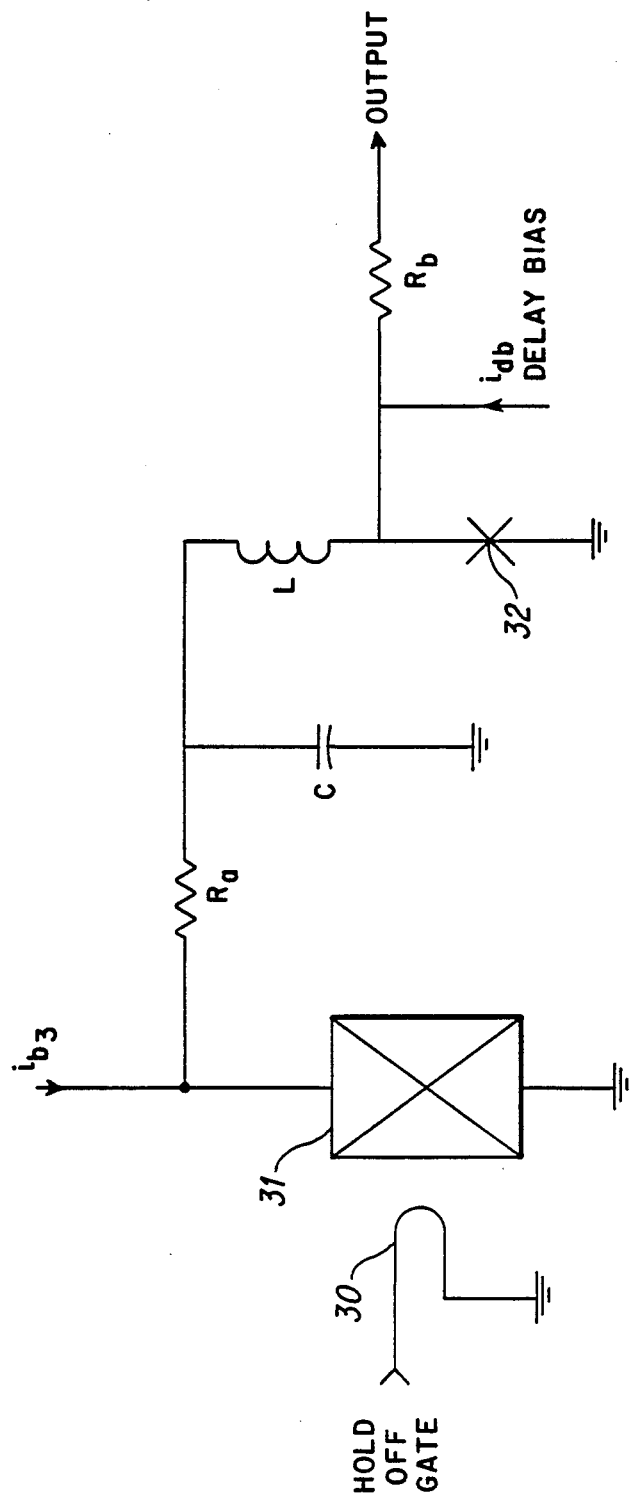
FIG. 3 is a schematic diagram of an embodiment of an electrical variable delay element from the schematic diagram of the present invention of FIG. 1.

FIG. 3 illustrates a schematic diagram for an embodiment of an electrical variable delay corresponding to element 14 of FIG. 1. In FIG. 3 a junction device 31 receives bias current ib3. The bias current ib3 is such that the junction device 31 is stabilized in a first voltage state. The bias current ib3 is also such that it defines a switching threshold for the junction device 31. If the threshold value is exceeded, the junction device switches to a high resistance. A signal from the hold-off gate is magnetically coupled to the junction device 31 by coil 30. When the signal appearing at coil 30 is of a sufficient value to exceed the switching threshold of device 31, the junction device 31 will switch to a high resistance state thereby diverting current ib3 through resistance Ra, a first end of which is connected to said junction device. The current is passed on to a resonance circuit composed of capacitance C, inductance L and a second junction device 32. The capacitance C is connected between a second end of resistance Ra and a reference potential. Inductance L and second junction device are in series relation and the combination is connected in parallel with the capacitance C. The second junction device also has a preset switching threshold of its own as defined by a delay bias idb. The current through inductance L and into the junction device 32 will increase as $(1-\cos(\omega t))$ where $$\omega = \frac{1}{2\pi \sqrt{LC}}$$

until junction device 32 is caused to switch voltage states when the threshold value set by delay bias idb has been exceeded by the current passing through inductance L. As junction 32 switches states, a current pulse is injected through resistance Rb as an output. This output is an input to the strobe pulse generator 15 of FIG. 1. Therefore, by changing the delay bias current idb, the trigger point of the junction device 32 can be adjusted and hence, the strobe pulse generation can be controlled along the rising portion of the signal $1-\cos(\omega t)$ that is produced by the delay generator. The inherent nonlinearity of the sweep should be compensated for externally in the delay bias current idb.

The electrical variable delay provides a high slew rate for low jitter and it also provides a predictable non-linearity. The delay is relatively immune to internal parasitic resonance effects.

In the electrical variable delay, when device 31 switches to a voltage state, bias current ib is dumped into resistor $R_a$. So long as a voltage ib $$\left(R + \sqrt{\frac{L}{C}}\right)$$

is less than the energy gap voltage $V_g$ then a current $I_L$ through the inductance L is defined by the equation $$I_L = i_b (1 - \cos(t/2\pi \sqrt{LC}))$$

The junction device 32 will switch when the delay bias current plus the current through the inductance L ($idb + I_L$) is equal to a critical switching current of the junction device 32. The time delay in by the electrical variable delay is equal to $$\cos^{-1} \left(1 - \frac{I_L - idb}{i_b}\right) \sqrt{LC}.$$

The non-linearity produced by the $\cos^{-1}$ can be compensated for by known external means.

Figure 4:
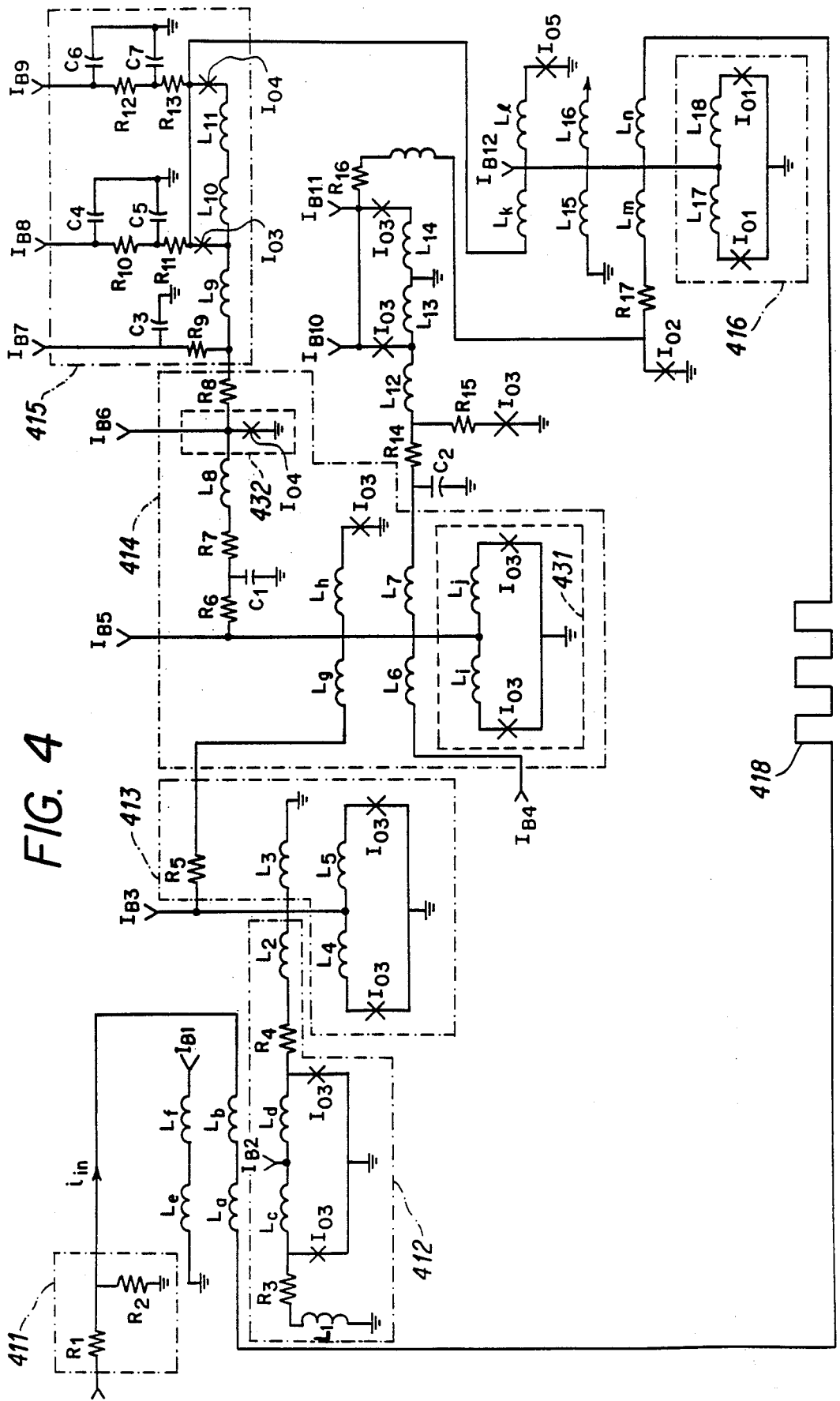
FIG. 4 is an electrical circuit diagram of an embodiment of the present invention illustrated in block diagram form in FIG. 1.

FIG. 4 illustrates an electrical diagram corresponding to the schematic block diagram of FIG. 1 which represents the integrated sampling oscilloscope of the present invention.

An input signal is input into a circuit defined by resistances $R_1$ and $R_2$ constituting attenuator 411. Signal $i_{in}$ is output from attenuator 411 to inductors La and Lb. This would be equivalent to the control line illustrated in FIG. 2 whereby inductors L1 and L2 link the attenuator to the delay line. In this case inductors Lb and La link attenuator 411 with delay line 418. Inductors Lc and Ld in a trigger recognizer 412 act as a symmetric interferometer for recognizing an input trigger signal. Inductors Le and Lf constitute a second control line corresponding to an offset line that is equivalent to that illustrated in FIG. 2, and which receives as an offset current $I_{B1}$. A bias signal $I_{B2}$ is applied to the interferometer in trigger recognizer 412. The output of the trigger recognizer 412 is an input into a hold-off gate 413 which is composed of another symmetric interferometer biased by current $I_{B3}$ so that the output signal produced by the trigger recognizer will only produce an output signal at the hold-off gate 413 when a hold-off line signifying a specific gating event is "high". $I_{B3}$ and $I_n$ are the bias and hold-off gate control signals respectively. When a signal is produced by the hold-off gate 413, it is received at inductors Lg and Lh which are magnetically coupled to inductors Li and Lj of a junction device 431. Junction device 431 and junction device 432 together with the resistances $R_6$, $R_7$ and $R_8$ capacitance $C_1$ and inductance $L_8$ connecting these elements comprise an electrical variable delay 414. Junction device 431 comprises a symmetric interferometer which detects a signal from the hold-off gate and causes the bias current $I_{B5}$ to pass to resistor $R_6$ and into the resonance circuit formed by capacitance $C_1$ and inductance $L_8$ within the electrical variable delay 414. This resonance circuit produces a resonant signal similar to that described above with respect to the circuitry of FIG. 3, which illustrates the operation of an electrical variable delay. The switching threshold of junction device 432 is set in accordance with current $I_{B6}$ introduced into the junction device 432 as shown in FIG. 4. When the resonant signal exceeds the switching threshold of junction device 432 an output signal is produced to strobe a pulse generator 415. Strobe pulse generator 415 is responsible for producing an output to inductors Lk and Ll which are magnetically coupled to a sampling gate 416. The signal from the delay line 418 appears on inductors Lm and Ln which are also magnetically coupled with the sampling gate 416.

The symbols $I_{01}$, $I_{02}$, $I_{03}$, $I_{04}$ and $I_{05}$ are used to designate a specific characteristic of each of the Josephson junctions "X" with which they are respectively associated. These symbols represent the critical value of the junction at which the junction will change states.

In the present invention, an integrated sampling oscilloscope is provided whereby low jitter and high performance is produced. The elements of the sampling oscilloscope utilize superconductor devices which may be Josephson junction devices. Since the elements utilize superconductor devices they may all be disposed on a single chip. It is possible to include an attenuator, a trigger recognizer comprising superconductor devices which may be Josephson junction devices, a hold-off gate which may comprise superconductor devices such as Josephson junction devices, an electrical variable delay which may comprise a plurality of superconductor devices which may be Josephson junction devices, a strobe pulse generator which may comprise superconductor devices such as Josephson junction devices and a sampling gate which includes superconductor devices such as Josephson junctions. A superconductor transmission line can be used create a fixed delay line. The result of the use of the superconductor devices in the configuration is circuitry of reduced size and enhanced electrical characteristics due to the disposition of the elements on a single chip, and a sampling oscilloscope which achieves a low jitter triggering from the input signal itself making use of the high sensitivity of Josephson junction devices as well as the wide bandwidth of superconducting transmission lines.

What is claimed is:

1. An integrated superconducting sampling oscilloscope, including a sampling gate connected to additional electronics, comprising:
    means for producing a first trigger signal;
    means for sensing said first trigger signal, said means for sensing producing a pulse signal when said first trigger signal is sensed;
    means for gating said pulse signal, said means for gating producing an output signal when said pulse signal exists concurrently with a gating event;
    means for producing a second trigger signal, having a variable delay, from said output signal of said means for gating;
    means for receiving said second trigger signal and producing a strobe pulse signal to the sampling gate in response to receipt of said second trigger signal; and
    means for receiving said first trigger signal and producing a signal having a fixed delay signal to the sampling gate.

2. The sampling oscilloscope of claim 1 wherein said means for producing a first trigger signal comprises an attenuator that receives an input signal and produces said first trigger signal from said input signal.

3. The sampling oscilloscope of claim 1 wherein said means for sensing said trigger signal comprises:
    a superconductor device producing said pulse signal when said first trigger signal exceeds a predetermined threshold; and
    means for biasing said superconductor device, said means for biasing setting said predetermined threshold.

4. The sampling oscilloscope of claim 3 wherein said superconductor device comprises an interferometer.

5. An integrated superconducting sampling oscilloscope, including a sampling gate connected to additional electronics, comprising:
    means for producing a first trigger signal;
    means for sensing said first trigger signal, said means for sensing producing a pulse signal when said first trigger signal is sensed;
    means for gating said pulse signal, said means for gating producing an output signal when said pulse signal exists concurrently with a gating event;
    means for producing a second trigger signal, having a variable delay, from said output signal of said means for gating wherein said means for producing said second trigger signal comprises,
        a first superconductor device having a predetermined switching threshold, said first superconductor device producing a first switching signal if said output signal of said means for gating exceeds said predetermined switching threshold,
        means for receiving said first switching signal and producing a resonance signal; and
        a second superconductor device having a second switching threshold, said second superconductor device receiving said resonance signal and producing said second trigger signal when said resonance signal exceeds said second switching threshold;
    means for receiving said second trigger signal and producing a strobe pulse signal to the sampling gate in response to receipt of said second trigger signal; and
    means for receiving said first trigger signal and producing a signal having a fixed delay signal to the sampling gate.

6. The sampling oscilloscope of claim 5 wherein said first superconductor device and said second superconductor device each comprise a Josephson junction device.

7. An integrated superconducting sampling oscilloscope, including a sampling gate connected to additional electronics, comprising:
means for producing a first trigger signal;
means for sensing said first trigger signal, said means for sensing producing a pulse signal when said first trigger signal is sensed wherein said means for sensing said trigger signal comprises,
a superconductor device producing said pulse signal when said first trigger signal exceeds a predetermined threshold, and
means for biasing said superconductor device, said means for biasing setting said predetermined threshold;
means for gating said pulse signal, said means for gating producing an output signal when said pulse signal exists concurrently with a gating event;
means for producing a second trigger signal, having a variable delay, from said output signal of said means for gating wherein said means for producing said second trigger signal comprises,
a first superconductor device having a predetermined switching threshold, said first superconductor device producing a first switching signal if said output signal of said means for gating exceeds said threshold,
means for receiving said first switching signal and producing a resonance signal, and
a second superconductor device having a second switching threshold, said second superconductor device receiving said resonance signal and producing said second trigger signal when said resonance signal exceeds said second switching threshold;
means for receiving said second trigger signal and producing a strobe pulse signal to the sampling gate in response to receipt of said second trigger signal; and
means for receiving said first trigger signal and producing a signal having a fixed delay signal to the sampling gate.

8. The sampling oscilloscope of claim 7 wherein said first superconductor device and said second superconductor device each comprise a Josephson junction device.

9. A device for producing an output signal from an input signal at an electrically variable time delay, comprising:
first superconductor device, having a switching threshold for receiving the input signal, said superconducting device producing a switching signal when said input signal exceeds said threshold;
means for receiving said switching signal connected to said first superconductor device and producing a resonance signal from said switching signal; and
second superconductor device connected to said means for receiving and having a second switching threshold, said second superconductor device producing the output signal when said resonance signal exceeds said second switching threshold.

10. The device of claim 9 wherein said first superconductor device comprises a first Josephson junction device and said second superconductor device comprises a second Josephson junction device.

11. A signal processor for producing two output signals from an input signal, comprising:
first means for receiving the input signal;
second means for producing a first output signal responsive to the input signal, said second means being coupled to said first means, and adapted to introduce a fixed time delay to the input signal; and
third means for producing a second output signal from said input signal, said third means being coupled to said first means, said third means comprising,
a trigger recognizer that produces a trigger output signal when said input signal exceeds a threshold value,
a hold off gate, coupled to said trigger recognizer, that produces a hold off output signal when said trigger signal exists concurrently with a predetermined event,
a delay generator, coupled to said hold off gate, that receives said hold off output signal and produces a delay output whereby said delay introduced by said delay generator is electrically variable, and
a strobe pulse generator coupled to said delay generator, said strobe pulse generator receives said delay output and produces a strobe pulse output as the second output signal in response to said delay output.

12. The signal processor of claim 11 wherein said trigger recognizer comprises:
a superconductor device producing said trigger output signal when said input signal exceeds said threshold value; and
means for biasing said superconductor device, said means for biasing determining said threshold value.

13. The signal processor of claim 11 wherein said delay generator comprises:
a first superconductor device having a predetermined switching threshold, said first superconductor device producing a first switching signal of said hold off output signal exceeds said predetermined switching threshold;
means for receiving said first switching signal and producing a resonance signal; and
a second superconductor device coupled to said means for receiving said first switching signal and having a second switching threshold, said second superconductor device receiving said resonance signal and producing said delay output when said resonance signal exceeds said second switching threshold.

14. A signal processor for producing two output signals from one input signal in a sampling oscilloscope, the signal processor being disposed on a single chip and comprising:
first means for receiving the input signal;
second means for producing a first output signal responsive to the input signal, said second means being coupled to said first means, and adapted to introduce a fixed time delay to the input signal; and
third means for producing a second output signal from said input signal, said third means being coupled to said first means, said third means comprising,
a trigger recognizer that produces a trigger output signal when said input signal exceeds a threshold value, a hold off gate, coupled to said trigger recognizer, that produces a hold off output signal when said trigger signal exists concurrently with a predetermined event, a delay generator, coupled to said hold off gate, that receives said hold off output signal and produces a delay output whereby said delay introduced by said delay generator is electrically variable, and a strobe pulse generator coupled to said delay generator, said strobe pulse generator receives said delay output and produces a strobe pulse output as second output signal in response to said delay output.

* * * * *